US012717236B2

(12) United States Patent
Fujimoto et al.

(10) Patent No.: US 12,717,236 B2
(45) Date of Patent: Aug. 25, 2026

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Masayoshi Fujimoto, Tochigi (JP); Ryosuke Hamamoto, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 42 days.

(21) Appl. No.: 18/538,308

(22) Filed: Dec. 13, 2023

(65) Prior Publication Data

US 2024/0210833 A1 Jun. 27, 2024

(30) Foreign Application Priority Data

Dec. 22, 2022 (JP) ................................ 2022-205991

(51) Int. Cl.
*G03F 7/24* (2006.01)
*G03F 7/00* (2006.01)

(52) U.S. Cl.
CPC ............ *G03F 7/24* (2013.01); *G03F 7/70716* (2013.01)

(58) Field of Classification Search
CPC ........................................................ G03F 7/70
See application file for complete search history.

(56) References Cited

U.S. PATENT DOCUMENTS

2014/0138354 A1* 5/2014 Ootera .................. G03F 7/0002 264/496
2021/0373217 A1* 12/2021 Tanabe ...................... G03F 7/20
2022/0382146 A1* 12/2022 Funayoshi ............ G03F 7/0002

FOREIGN PATENT DOCUMENTS

WO 2020194815 A1 10/2020

* cited by examiner

*Primary Examiner* — Chanceity N Robinson
(74) *Attorney, Agent, or Firm* — ROSSI, KIMMS & McDOWELL LLP

(57) ABSTRACT

An imprint method of forming a patterned composition on a shot region of a substrate by using a mold having a concave-convex pattern includes filling a concave portion of the concave-convex pattern of the mold with a first composition by bringing the mold into contact with the first composition on a predetermined region and then separating the mold from the predetermined region in a state in which the first composition on the predetermined region is uncured. The mold having undergone the filling is brought into contact with a second composition on the shot region, thereby integrating the first composition filling the concave portion of the concave-convex pattern of the mold with the second composition on the shot region to form an integrated composition. The integrated composition is cured to form the patterned composition and separated from the mold.

10 Claims, 7 Drawing Sheets

2
2a
6
6a
17
16
12
7
5
15
13
3b
3
3a
10
4b
4a
4
14
1
8a
8
18
19
9
X
Y
Z

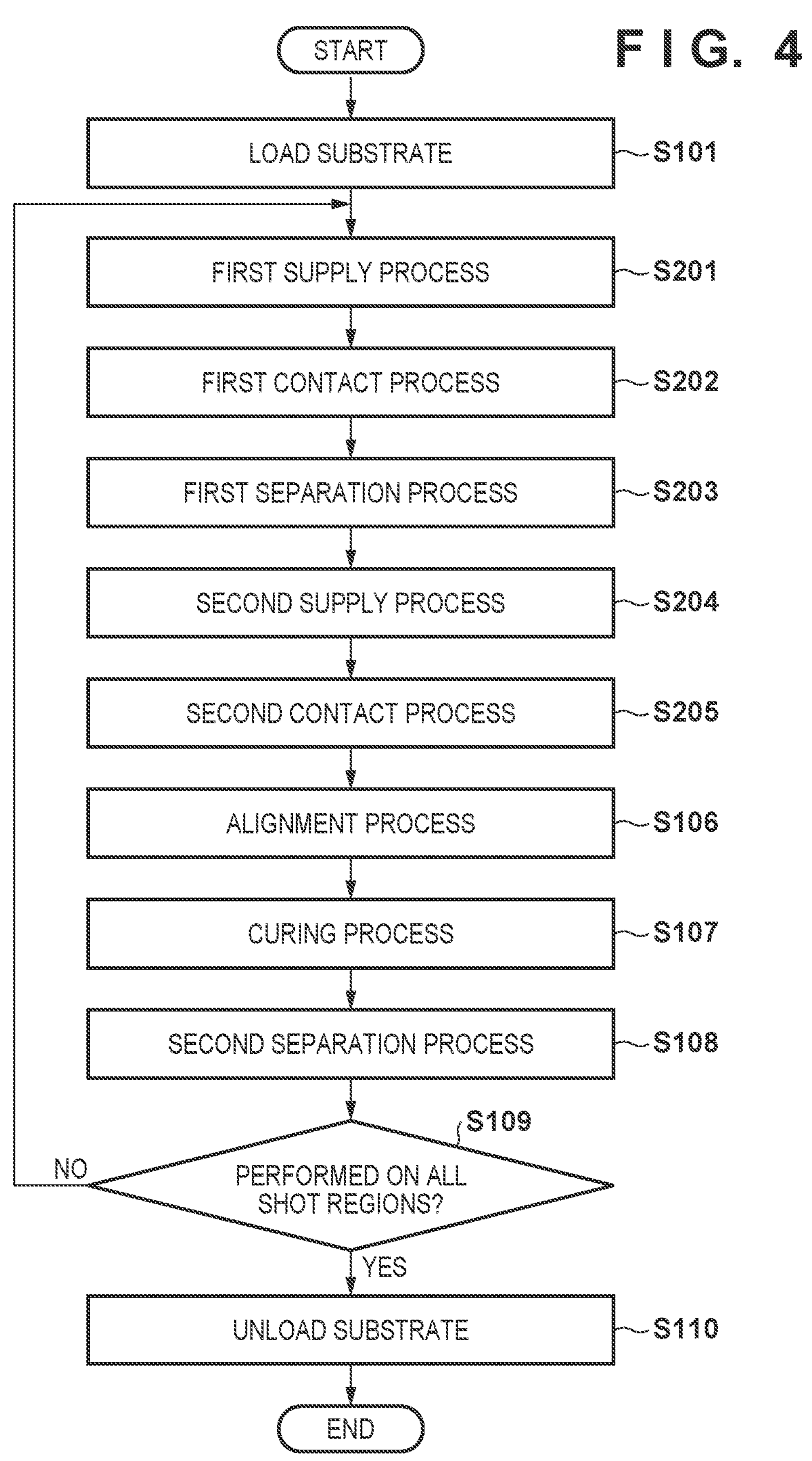
F I G. 4
START
LOAD SUBSTRATE
S101
FIRST SUPPLY PROCESS
S201
FIRST CONTACT PROCESS
S202
FIRST SEPARATION PROCESS
S203
SECOND SUPPLY PROCESS
S204
SECOND CONTACT PROCESS
S205
ALIGNMENT PROCESS
S106
CURING PROCESS
S107
SECOND SEPARATION PROCESS
S108
S109
PERFORMED ON ALL SHOT REGIONS?
NO
YES
UNLOAD SUBSTRATE
S110
END

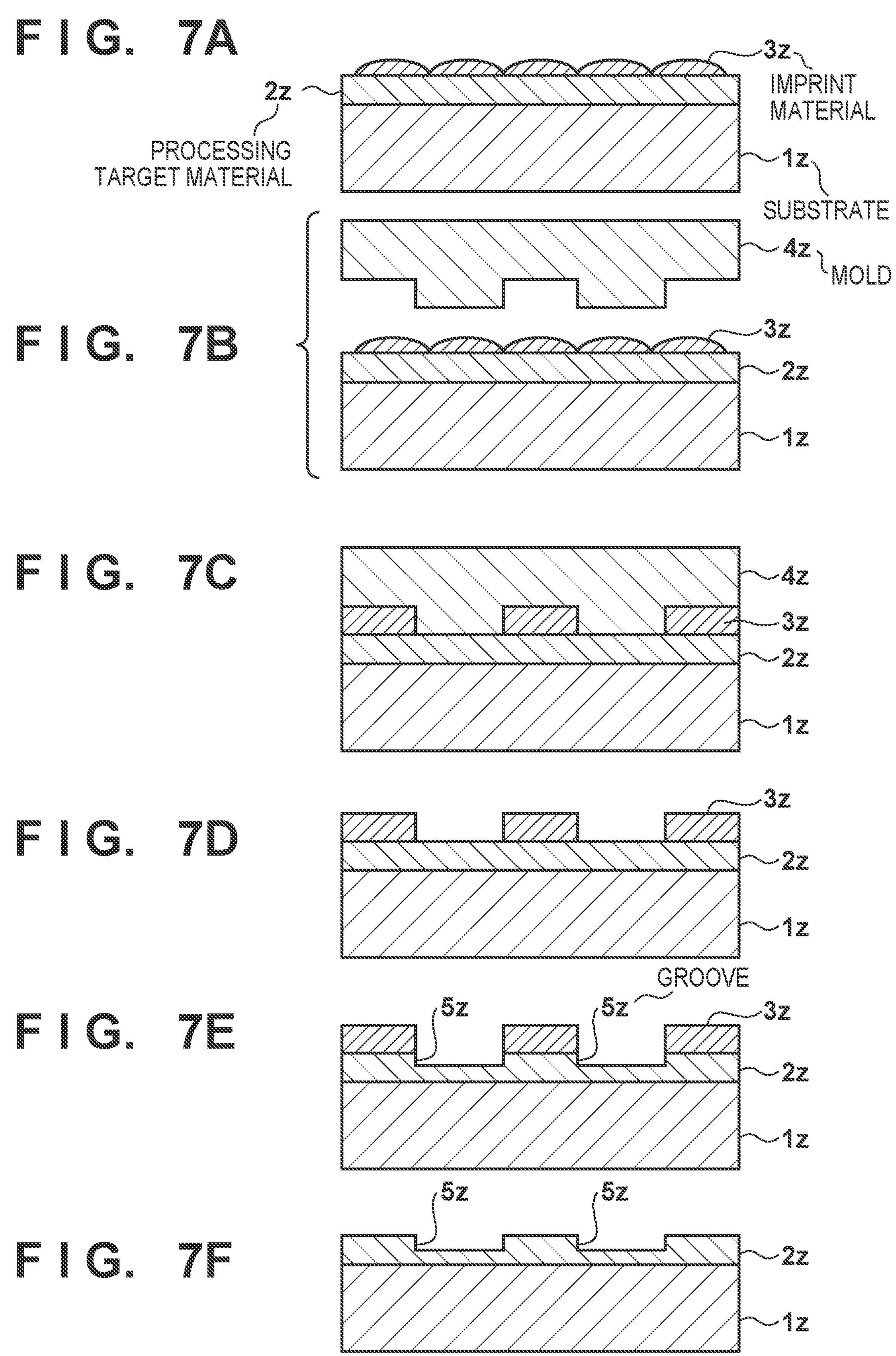
F I G. 7A
3z
IMPRINT MATERIAL
2z
PROCESSING TARGET MATERIAL
1z
SUBSTRATE
F I G. 7B
4z
MOLD
3z
2z
1z
F I G. 7C
4z
3z
2z
1z
F I G. 7D
3z
2z
1z
F I G. 7E
GROOVE
5z
5z
3z
2z
1z
F I G. 7F
5z
5z
2z
1z

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

As one of lithography techniques for satisfying a demand for microfabrication of a semiconductor device, a magnetic storage medium, an MEMS, or the like, a microfabrication technique of molding a composition on a substrate by using a mold having a concave-convex pattern and forming a pattern of the composition on the substrate has received a great deal of attention. This technique is also called an imprint technique, and can form a fine structure on the order of several nanometers on the substrate. For example, a photo-curing method is one of the imprint techniques. In an imprint apparatus employing the photo-curing method, while a photo-curable composition (imprint material) on a substrate (wafer) is in contact with a mold, the composition is irradiated with light (for example, ultraviolet light) to cure the composition, and then the mold is separated from the cured composition. With this, a pattern made of a cured product of the composition is formed on the substrate. In addition to the photo-curing method, the imprint technique includes a heat curing method in which, while a thermosetting composition on a substrate is in contact with a mold, heat is applied to the composition, thereby curing the composition, and the like.

In the imprint technique, when the mold is brought into contact with the composition on the substrate, the concave portion of the concave-convex pattern of the mold is filled with the composition due to a capillary force or the like. On the other hand, a gas existing in the concave portion of the concave-convex pattern of the mold is pushed out from the concave portion as the concave portion is filled with the composition, and can remain as bubbles in the composition between the mold and the substrate. If the composition is cured in a state in which these bubbles remain in the composition, defects (so-called unfilled defects) can occur in the portions where the bubbles exist. Waiting until the bubbles disappear can be disadvantageous in terms of throughput. Therefore, in the imprint technique, it is desirable to reduce the bubbles in the composition to accurately form a pattern of the composition on the substrate.

As one method of reducing the bubbles in the composition, a method is conceivable in which, as disclosed in International Publication No. 2020/194815, the composition is directly supplied to the concave-convex pattern of the mold while the concave-convex pattern faces upward, and then the substrate is brought into contact with the composition supplied to the mold. However, in the imprint technique, the mold is usually bought into contact with the composition on the substrate while the substrate is arranged below the mold, so that the concave-convex pattern of the mold faces downward. Accordingly, it is difficult to apply the method described in International Publication No. 2020/194815.

SUMMARY OF THE INVENTION

The present invention provides, for example, a technique advantageous in accurately forming a pattern of a composition on a substrate.

According to one aspect of the present invention, there is provided an imprint method of forming a pattern of a composition on a shot region of a substrate by using a mold having a concave-convex pattern, the method comprising: filling a concave portion of the concave-convex pattern of the mold with a composition by bringing the mold into contact with a composition on a predetermined region and then separating the mold from the predetermined region in a state in which the composition on the predetermined region is uncured; bringing the mold having undergone the filling into contact with a composition on the shot region, thereby integrating the composition filling the concave portion of the concave-convex pattern of the mold with the composition on the shot region; curing an integrated composition obtained in the bringing; and separating the mold from the cured composition obtained in the curing.

Further features of the present invention will become apparent from the following description of exemplary embodiments with reference to the attached drawings.

BRIEF DESCRIPTION OF THE DRAWINGS

FIG. 4 is a flowchart illustrating an imprint process according to the second embodiment;

FIG. 6 is a view showing an arrangement example of a substrate stage that holds a substrate, and a stage including a supply region; and FIGS. 7A to 7F are views for explaining an article manufacturing method.

DESCRIPTION OF THE EMBODIMENTS

Figure 1:
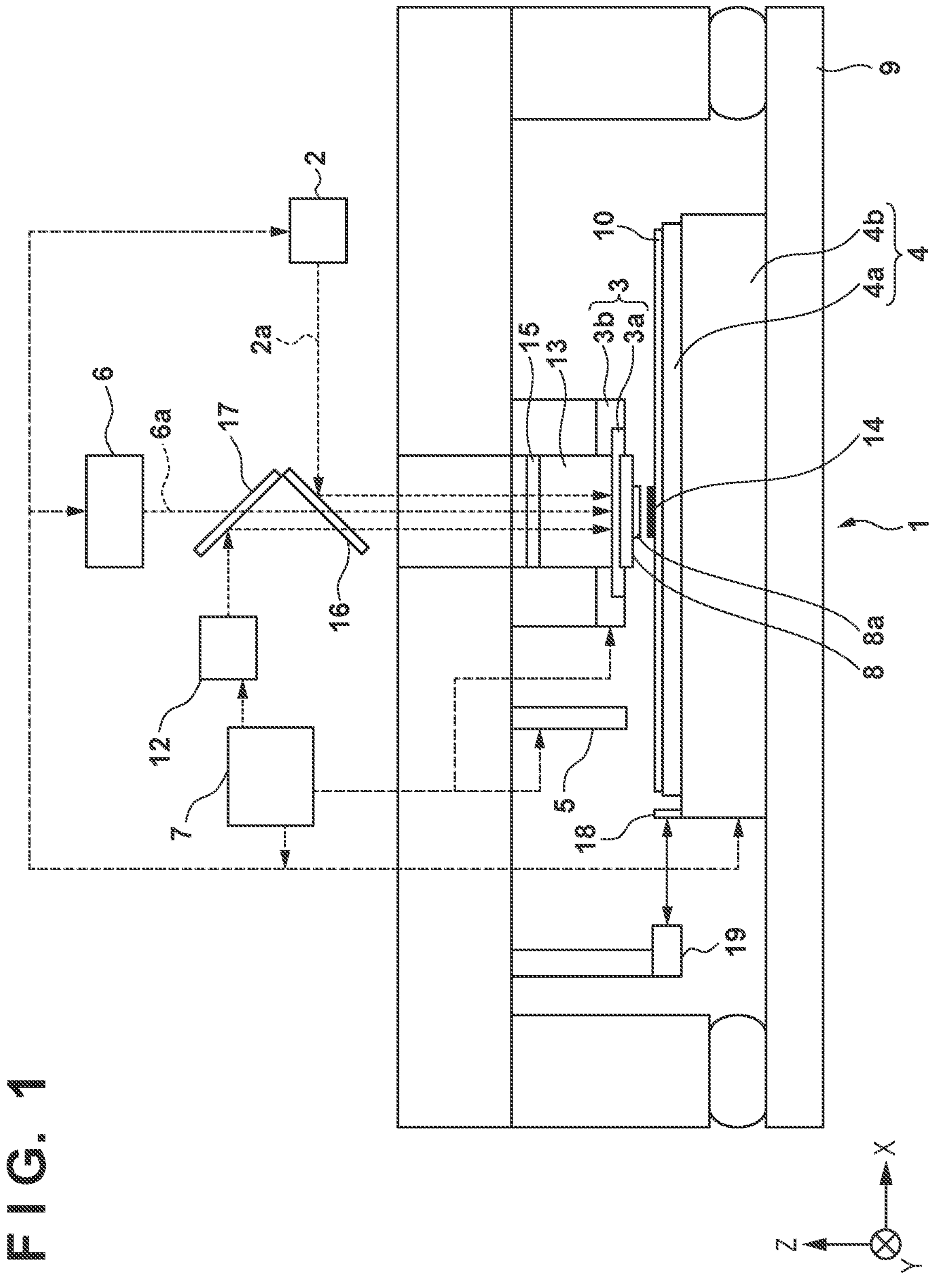
FIG. 1 is a schematic view showing an arrangement example of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX,θY, and θZ, respectively. Control or driving (movement) concerning the X-axis, the Y-axis, and the Z-axis means control or driving (movement) concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

First Embodiment

The first embodiment according to the present invention will be described. FIG. 1 is a schematic view showing an arrangement example of an imprint apparatus 1 according to this embodiment. The imprint apparatus 1 is employed in a lithography step that is a manufacturing step for a device such as a semiconductor element, a liquid crystal display element, or magnetic storage medium as an article. The imprint apparatus 1 is a lithography apparatus that forms a pattern of an imprint material 14 (composition) on a substrate 10 by using a mold 8. The imprint apparatus 1 brings the mold 8 into contact with the uncured imprint material 14 supplied onto the substrate 10 to press the mold 8 against the imprint material 14, and applies curing energy to the imprint material 14, thereby forming a pattern of a cured product to which the concave-convex pattern of the mold 8 has been transferred. More specifically, the imprint apparatus 1 supplies the liquid imprint material 14 onto the substrate 10, and irradiates the imprint material 14 with light in a state in which the mold 8 having the concave-convex pattern is in contact with the imprint material 14 on the substrate 10, thereby curing the imprint material 14. Then, the mold 8 is separated from the cured imprint material 14. Thus, the concave-convex pattern of the mold 8 can be transferred to the imprint material 14 on the substrate. The series of processing as described above is called an "imprint process", and performed for each of a plurality of shot regions of the substrate 10. Note that the mold 8 can also be called a template or an original.

As the imprint material 14, a curable composition (to be also referred to as a resin in an uncured-state) that is cured by receiving curing energy is used. Examples of the curing energy are an electromagnetic wave, heat, and the like. The electromagnetic wave can include, for example, light selected from the wavelength range of 10 nm (inclusive) to 1 mm (inclusive), more specifically, infrared light, a visible light beam, or ultraviolet light. The curable composition is a composition which is cured by light irradiation or heating. A photo-curable composition which is cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material 14 May be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

The mold 8 includes a pattern region *8a* in a part of the surface facing the substrate 10. The pattern region *8a* is a region where the concave-convex pattern (pattern with concave and convex portions) to be transferred to the imprint material 14 on each shot region of the substrate 10 is provided, and can be formed in, for example, a mesa shape protruding toward the substrate side. As the material of the mold 8, a material such as silica glass that can transmit light (ultraviolet light) can be used. As the material of the substrate 10, glass, ceramic, a metal, a semiconductor, a resin, or the like can be used. A member made of a material different from that of the substrate may be formed on the surface of the substrate 10, as needed. More specifically, the substrate 10 includes, for example, a silicon wafer, a semiconductor compound wafer, silica glass, or the like.

The imprint apparatus 1 includes an imprint head 3 (mold holder) that holds and drives the mold 8, a substrate stage 4 (substrate holder) that holds and moves the substrate 10, and a supply unit 5 (supplier) that supplies the imprint material onto the substrate. The imprint apparatus 1 also includes a curing unit 2 (curing device) that cures the imprint material, an observation unit 6 that observes the contact state between the mold 8 and the imprint material on the substrate, and a control unit 7 (controller) that controls the entire imprint apparatus 1. Further, the imprint apparatus 1 includes a detection unit 12 (detector) that detects marks (alignment marks) respectively provided on the mold 8 and the substrate 10.

The curing unit 2 cures the imprint material 14 in a state in which the mold 8 is in contact with the imprint material 14 on the substrate. The imprint apparatus 1 according to this embodiment uses, as the imprint material, a photo-curable (ultraviolet-light curable) imprint material which is cured by receiving light *2a* (for example, ultraviolet light), and employs the photo-curing method as the curing method of the imprint material. Accordingly, in the imprint apparatus 1 according to this embodiment, a light irradiation unit (light irradiator) that cures the imprint material 14 by irradiating the imprint material 14 on the substrate with light *2a* via the mold 8 is provided as the curing unit 2. In the arrangement example shown in FIG. 1, the light irradiation unit serving as the curing unit 2 is configured to apply the light *2a* to the imprint material 14 on the substrate by reflecting the light *2a* by a half mirror 16. Note that the curing method of the imprint material is not limited to the photo-curing method, and a heat-curing method that cures the imprint material using heat may be employed. In a case of employing the heat-curing method, a heating unit (heater) that applies heat for curing the imprint material to the imprint material can be provided as the curing unit 2 of the imprint apparatus 1 in place of the light irradiation unit.

The substrate stage 4 is configured to be movable on a base plate 9 while holding the substrate 10. In this embodiment, the substrate stage 4 includes a substrate chuck *4a* that holds the substrate 10, and a substrate driving unit 4b (substrate driver) that drives the substrate 10 (specifically, substrate chuck *4a*) at least in the X direction and the Y direction in the XYZ coordinate system. The substrate driving unit *4b* includes, for example, an actuator. The position of the substrate stage 4 is measured using a mirror 18 provided on the substrate stage 4, and an interferometer 19. However, the position of the substrate stage 4 May be measured using an encoder in place of the mirror 18 and the interferometer 19.

The imprint head 3 includes a mold chuck 3a that holds the mold 8, and a mold driving unit *3b* (mold driver) that drives the mold 8 (specifically, mold chuck *3a*) at least in the Z direction (vertical direction) in the XYZ coordinate system. The mold driving unit *3b* includes, for example, an actuator. The mold driving unit *3b* performs a contact process of bringing the pattern region 8a of the mold 8 into contact with the imprint material 14 on the substrate by driving the mold 8 (mold chuck *3a*) downward (-Z direction). Once the mold 8 (pattern region *8a*) contacts the imprint material 14 on the substrate, a force (pressing force) applied to the mold 8 and the imprint material 14 on the substrate is controlled to be constant under the control of the control unit 7. After the imprint material 14 on the substrate is cured, the mold driving unit 3*b* performs a separation process (mold separation process) of separating the pattern region 8*a* of the mold 8 from the cured imprint material 14 on the substrate by driving the mold 8 (mold chuck 3*a*) upward (+Z direction).

In this embodiment, the contact process and/or the mold separation process is performed by the mold driving unit 3*b* driving the mold 8 (mold chuck 3*a*). However, the present invention is not limited to this. For example, the contact process and/or the mold separation process may be performed by the substrate driving unit 4*b* driving the substrate 10 (substrate chuck 4*a*). That is, at least one of the mold driving unit 3*b* and the substrate driving unit 4*b* may function as the driving unit (driver) that performs the contact process and/or the mold separation process by relatively driving the mold 8 and the substrate 10.

Here, the imprint head 3 that holds the mold 8 can include a posture adjustment unit that adjusts the tilt of the mold 8. Similarly, the substrate stage 4 that holds the substrate 10 can include a posture adjustment unit that adjusts the tilt of the substrate 10. The mold 8 and the substrate 10 can be made parallel to each other by correcting the relative tilt between the mold 8 and the substrate 10 by using the posture adjustment units. The relative tilt between the mold 8 and the substrate 10 May be corrected by one of the imprint head 3 and the substrate stage 4, or may be corrected by both the imprint head 3 and the substrate stage 4.

The imprint head 3 is provided with an opening for allowing light from each of the curing unit 2, the observation unit 6, and the detection unit 12 to pass therethrough. A partition plate 15 made of a light transmitting member is provided in the opening, and a space 13 is defined by the partition plate 15 and the mold 8. In this case, by adjusting the pressure in the space 13 by a pressure adjustment unit (not shown), the mold 8 (pattern region 8a) can be deformed during the contact process and/or the mold separation process. For example, in the contact process, the pressure in the space 13 is made higher than the external pressure to deform the pattern region 8*a* of the mold 8 into a convex shape with the central portion protruding toward the substrate 10. With this, it is possible to gradually bring the mold 8 into contact with the imprint material 14 on the substrate from a part (for example, the central portion) of the pattern region 8a toward the outside.

The supply unit 5 includes a dispenser including one or more discharge outlets to discharge the imprint material 14. The supply unit 5 causes the dispenser to discharge (drop) the imprint material 14, thereby supplying the imprint material 14 onto the substrate. For example, while the substrate 10 is moving in the X direction below the supply unit 5, the supply unit 5 (dispenser) discharges the imprint material 14 as a plurality of droplets each having a minute volume. With this, the supply unit 5 can supply the imprint material 14 onto the substrate (onto the shot region).

The observation unit 6 observes the contact state between the pattern region 8*a* of the mold 8 and the imprint material 14 on the substrate. More specifically, the observation unit 6 includes an image capturing device (image sensor) that captures the pattern region of the mold 8 by using light 6*a*. In the contact process and/or the mold separation process, the observation unit 6 observes (captures) the contact state between the pattern region 8*a* of the mold 8 and the imprint material 14 on the substrate by the image capturing device. In the arrangement example shown in FIG. 1, the observation unit 6 is configured to observe (capture) the contact state via the half mirror 16 and a half mirror 17.

The detection unit 12 detects the mark provided on the mold 8 and the mark provided on the substrate 10. In the arrangement example shown in FIG. 1, the detection unit 12 is configured to detect the mark on the mold 8 and the mark on the substrate 10 via reflection by the half mirror 17 and transmission through the half mirror 16. With this, the control unit 7 can control alignment between the mold 8 and the substrate 10 by driving at least one of the mold 8 and the substrate 10 based on the relative position (positional shift) between the mold 8 and the substrate 10 obtained from the detection result of the detection unit 12.

The control unit 7 is formed from an information processing apparatus (computer) including a processor such as a Central Processing Unit (CPU) and a storage unit such as a memory. The control unit 7 comprehensively controls the respective units of the imprint apparatus 1 in accordance with programs stored in the storage unit, thereby controlling the imprint process of forming a pattern in each shot region of the substrate and processing concerning the imprint process. The control unit 7 May be provided in the apparatus or outside the apparatus.

The imprint process according to this embodiment performed by the imprint apparatus 1 described above will be described below with reference to FIGS. 2 and 3. In the imprint process according to this embodiment, after performing a filling process of filling the concave portion of the concave-convex pattern of the mold 8 (pattern region 8a) with the imprint material 14, a contact process of bringing the mold 8 having undergone the filling process into contact with the imprint material 14 on a shot region of the substrate 10. In the filling process, the mold 8 is brought into contact with the imprint material 14 on a predetermined region, and then the mold 8 is separated from the predetermined region in a state in which the imprint material 14 on the predetermined region is uncured, thereby filling the concave portion of the concave-convex pattern of the mold 8 with the imprint material 14. In this embodiment, an example will be described in which the filling process is performed while using, as the predetermined region, the shot region as the target of the imprint process (to be sometimes referred to as a target shot region hereinafter) among the plurality of shot regions of the substrate 10.

Figure 2:
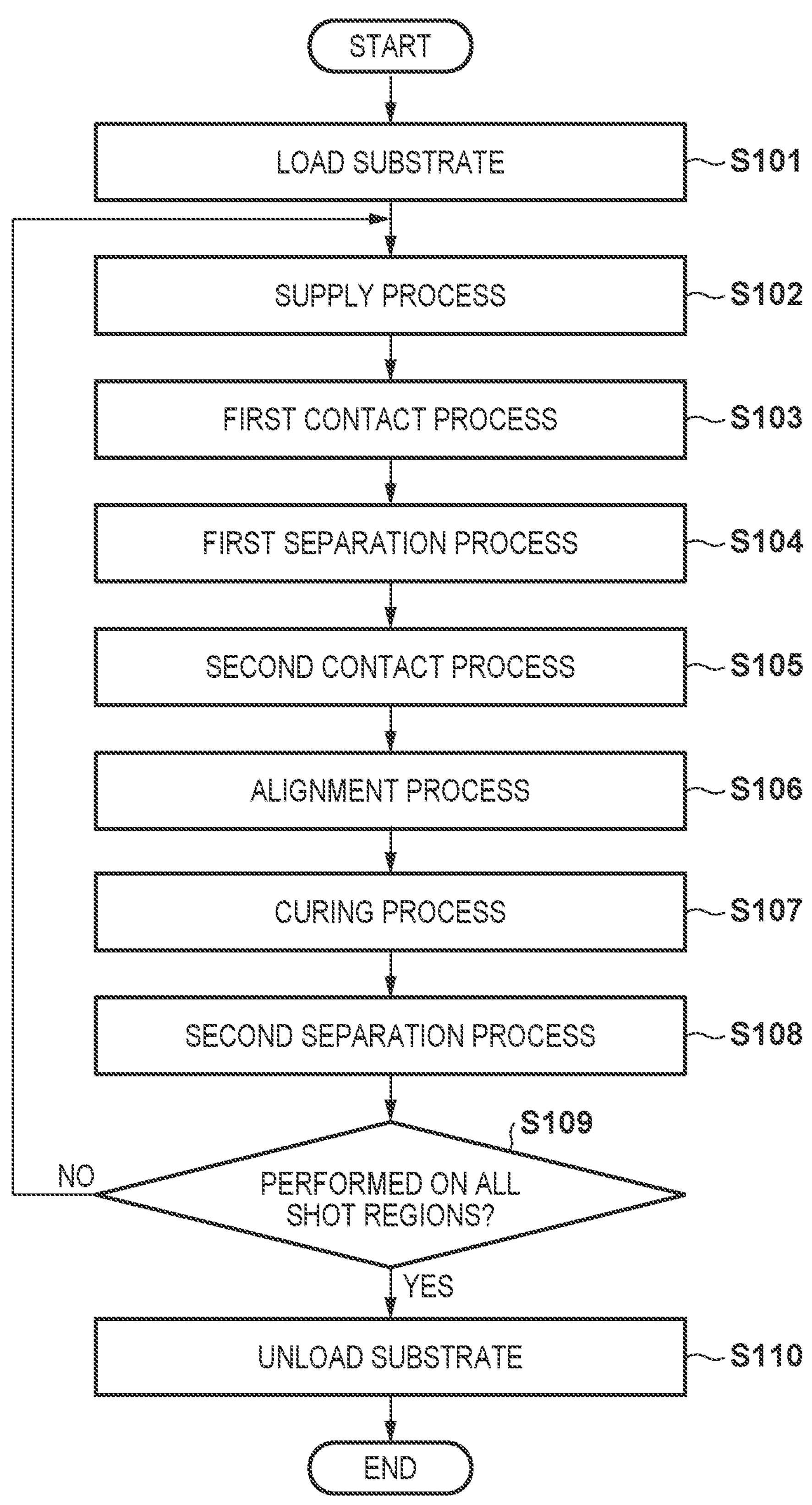
FIG. 2 is a flowchart illustrating an imprint process according to the first embodiment.

FIG. 2 is a flowchart illustrating the imprint process according to this embodiment. The flowchart of FIG. 2 shows an example in which the imprint process is performed on each of the plurality of shot regions of one substrate 10, and the imprint process can be repetitively performed on each of a plurality of the substrates 10. FIGS. 3A to 3D are views for explaining the imprint process (steps of the flowchart of FIG. 2) according to this embodiment. In FIGS. 3A to 3D, for the sake of illustrative simplicity, the mold 8, the substrate 10, and the imprint material 14 alone are shown. Note that, as has been described above, the imprint process is a process of molding the imprint material 14 on the shot region of the substrate 10 by using the mold 8, thereby forming a pattern of the imprint material on the shot region. The imprint process can be controlled by the control unit 7.

In step S101, the control unit 7 loads the substrate 10 to the imprint apparatus 1. More specifically, the control unit 7 loads the substrate 10 onto the substrate stage 4 (substrate chuck 4*a*) by a substrate conveyance mechanism (not shown), and causes the substrate stage 4 to hold the substrate 10.

Figure 3A:
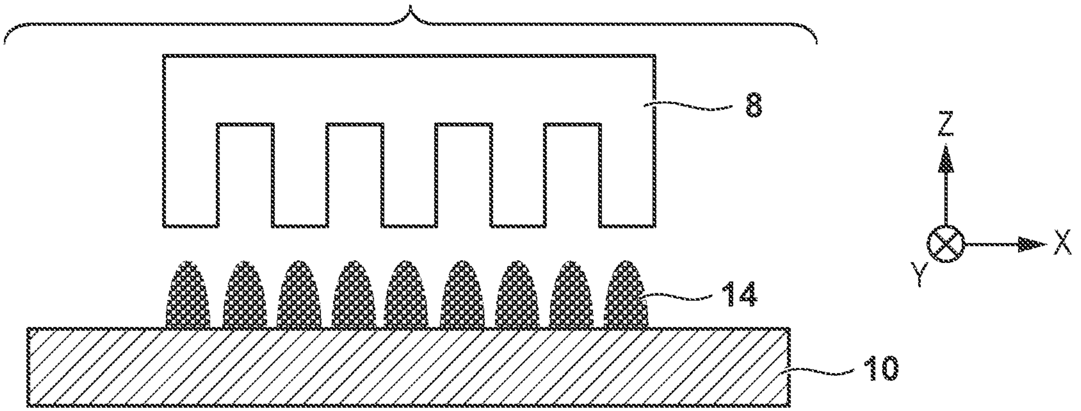
FIGS. 3A to 3D are views for explaining the imprint process according to the first embodiment.

In step S102, the control unit 7 supplies the imprint material 14 onto the target shot region by the supply unit 5 (supply process). More specifically, the control unit 7 causes the supply unit 5 to discharge the imprint material 14 as a plurality of droplets toward the target shot region of the substrate 10 while moving the substrate 10 below the supply unit 5 by the substrate stage 4. With this, the imprint material 14 is supplied as the plurality of droplets onto the target shot region of the substrate 10. Then, the control unit 7 causes the substrate stage 4 to move the substrate 10 such that the target shot region with the imprint material 14 supplied thereon is arranged below the pattern region 8a of the mold 8. FIG. 3A shows the state in which step S102 has been performed.

Here, the amount of the imprint material 14 to be supplied onto the target shot region in step S102 is preferably equal to or larger than the volume of the concave portion of the concave-convex pattern of the mold 8 (more specifically, equal to or larger than the total volume of the concave portions). For example, based on pattern information (for example, design information) indicating the arrangement of the concave-convex pattern of the mold 8 and the residual layer thickness (target value) to be formed on the target shot region, the control unit 7 can decide the amount of the imprint material 14 to be supplied onto the target shot region in step S102. The pattern information can include information indicating the volume of the concave portion of the concave-convex pattern of the mold 8. As the information indicating the volume of the concave portion, information indicating the area and depth of the concave portion of the concave-convex pattern of the mold 8 May be used. Note that the residual layer thickness is the thickness between the substrate 10 and the bottom surface of the concave portion in the concave-convex pattern of the imprint material 14 (cured product) formed on the target shot region by undergoing the imprint process. The residual layer thickness is sometimes called a RLT.

Figure 3B:
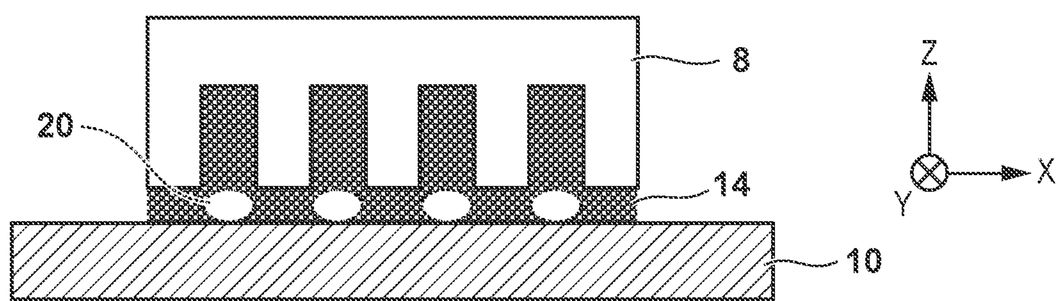
Figure 3C:
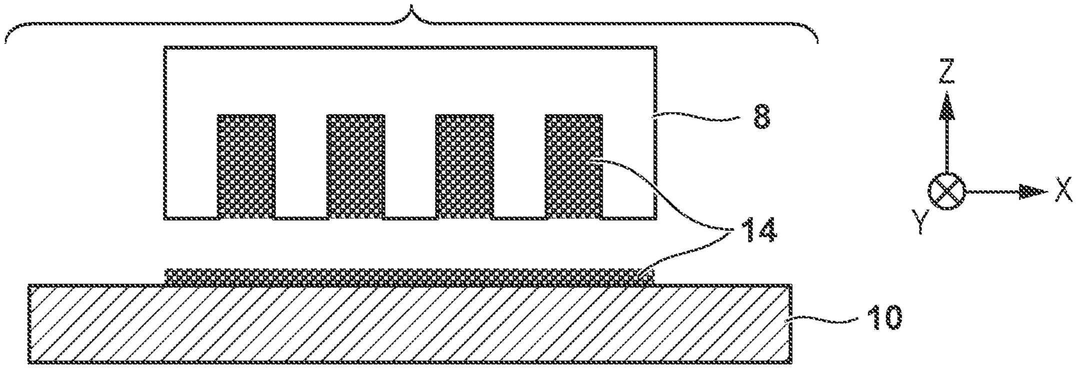

In step S103, the control unit 7 drives the mold 8 by the imprint head 3 to bring the mold 8 relatively close to the substrate 10, thereby bringing the mold 8 into contact with the imprint material 14 on the target shot region (first contact process). Step S103 can be performed in a state in which the target shot region as the predetermined region is arranged below the mold 8. FIG. 3B shows a state in which step S103 has been performed. Then, in step S104, the control unit 7 drives the mold 8 by the imprint head 3 to separate the mold 8 relatively away from the substrate 10, thereby separating the mold 8 from the target shot region (first separation process). Step S104 is performed in a state in which the imprint material 14 on the target shot region is uncured. FIG. 3C shows a state in which step S104 has been performed.

When the mold 8 (pattern region 8*a*) is brought into contact with the imprint material 14 on the target shot region in step S103, the concave portion of the concave-convex pattern of the mold 8 is filled with the imprint material 14 due to a capillary force or the like. On the other hand, a gas existing in the concave portion is pushed out from the concave portion as the concave portion is filled with the imprint material 14. Then, as shown in FIG. 3B, the gas can remain as a bubble 20 in the imprint material 14 between the mold 8 and the target shot region of the substrate 10. If the imprint material 14 is cured in a state in which the bubble 20 remains in the imprint material 14, a defect (so-called unfilled defect) can occur in the portion where the bubble 20 remains. The bubble 20 remaining in the imprint material 14 can be gradually absorbed by the imprint material 14, the mold 8, and the substrate 10 and disappear, but waiting until the bubble 20 disappears can be disadvantageous in terms of throughput (productivity). Therefore, in this embodiment, as shown in FIG. 3C, the mold 8 is temporarily separated from the target shot region in step S104. With this operation, the bubble 20 remaining in the imprint material 14 between the mold 8 and the target shot region is released.

In this manner, in this embodiment, the concave portion of the concave-convex pattern of the mold 8 is filled with the imprint material by undergoing steps S103 and S104. That is, steps S103 and S104 correspond to the filling process of filling the concave portion of the concave-convex pattern of the mold 8 with the imprint material 14, and will be sometimes referred to as the "filling process" below. Step S102 may be understood as a process of supplying, onto the predetermined region (onto the target shot region in this embodiment), the imprint material 14 to fill the concave portion of the concave-convex pattern of the mold 8. In this case, the filling process may further include step S102. Note that the imprint material 14 filled in the concave portion of the concave-convex pattern of the mold 8 remains filled in the concave portion due to a capillary force or the like even after the mold 8 is separated from the target shot region of the substrate 10 in step S104. The imprint material 14 remining on the target shot region of the substrate 10 can spread on the target shot region.

In step S105, the control unit 7 drives the mold 8 by the imprint head 3 to bring the mold 8 relatively close to the substrate 10, thereby bringing the mold 8 having undergone the filling process into contact with the imprint material 14 on the target shot region (second contact process). In this embodiment, the imprint material 14 is not supplied onto the target shot region after the filling process, and the mold 8 having undergone the filling process is brought into contact with the imprint material 14 remaining on the target shot region after the filling process.

Figure 3D:
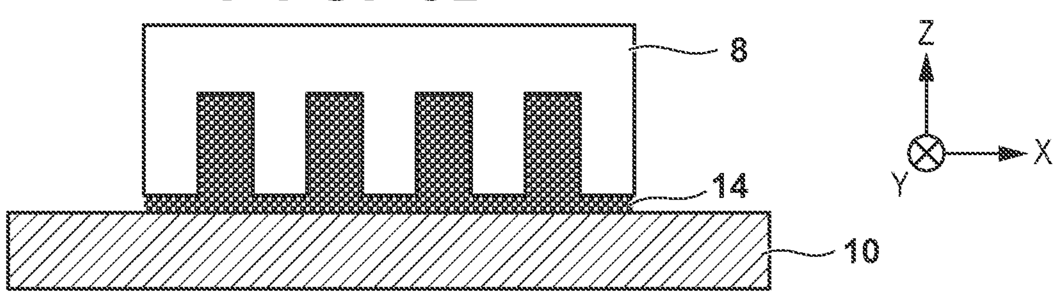

With this, the imprint material 14 filled in the concave portion of the concave-convex pattern of the mold 8 by undergoing the filling process can be integrated (merged, combined, or coupled) with the imprint material 14 remaining on the target shot region. FIG. 3D shows a state in which step S105 has been performed. In step S105, since the concave portion of the concave-convex pattern of the mold 8 is filled with the imprint material 14 by the filling process described above and no gas exists therein, generation of the bubble 20 as in step S103 is reduced.

In step S106, the control unit 7 drives the substrate 10 by the substrate stage 4 to perform alignment between the pattern region 8*a* of the mold 8 and the target shot region of the substrate 10 (alignment process). For example, the control unit 7 causes the detection unit 12 to detect the mark on the mold 8 (pattern region 8*a*) and the mark on the substrate 10 (target shot region), and performs alignment between the mold 8 and the substrate 10 such that the positional shift between the mold 8 and the substrate 10 obtained from the detection result falls within an allowable range.

In step S107, the control unit 7 cures the integrated imprint material 14 obtained in step S105 (curing process). More specifically, the control unit 7 cures the integrated imprint material 14 by irradiating the integrated imprint material 14 with light by the curing unit 2 in a state in which the mold 8 is in contact with the target shot region of the substrate 10 via the integrated imprint material 14. Then, in step S108, the control unit 7 drives the mold 8 by the imprint head 3 to separate the mold 8 relatively away from the substrate 10, thereby separating the mold 8 from the cured imprint material obtained in step S107 (second separation process).

In step S109, the control unit 7 determines whether the imprint process has been performed on all the shot regions of the substrate 10. If there is a shot region not having undergone the imprint process, the control unit 7 returns to step S102, and performs the imprint process while setting this shot region as the target shot region. On the other hand, if the imprint process has been performed on all the shot regions, the control unit 7 advances to step S110. In step S110, the control unit 7 unloads the substrate 10 from the imprint apparatus 1. More specifically, the control unit 7 unloads the substrate 10 from the substrate stage 4 (substrate chuck 4*a*) by the substrate conveyance mechanism (not shown).

As has been described above, in this embodiment, after performing the filling process of filling the concave portion of the concave-convex pattern of the mold 8 with the imprint material 14, the contact process of bringing the mold 8 having undergone the filling process into contact with the imprint material 14 on the target shot region of the substrate 10 is performed. In the filling process, the mold 8 is brought into contact with the imprint material 14 on the target shot region, and then separated from the target shot region in the state in which the imprint material 14 on the target shot region is uncured, thereby filling the concave portion of the concave-convex pattern of the mold 8 with the imprint material 14. With this, it is possible to reduce bubbles remaining in the imprint material 14 between the mold 8 and the substrate 10, thereby accurately forming a pattern of the imprint material 14 on the substrate 10.

Second Embodiment

The second embodiment according to the present invention will be described. In the first embodiment described above, the example has been described in which, in the second contact process, the mold 8 having undergone the filling process is brought into contact with the imprint material 14 remaining on the target shot region after the filling process. That is, in the first embodiment, the example has been described in which the imprint material 14 is not supplied onto the target shot region of the substrate 10 between the filling process and the second contact process. On the other hand, in this embodiment, an example will be described in which, in order to accurately control the residual layer of an imprint material 14, the imprint material 14 is supplied (replenished) onto the target shot region of a substrate 10 between the filling process and the second contact process. Note that this embodiment basically takes over the first embodiment, and can follow the first embodiment except matters to be described below.

FIG. 4 is a flowchart illustrating the imprint process according to this embodiment. In this embodiment, an example will be described in which, as in the first embodiment, a filling process is performed while using a target shot region of the substrate 10 as a predetermined region. In the flowchart of FIG. 4, as compared to the flowchart of FIG. 2 described in the first embodiment described above, steps S102 to S105 are replaced with steps S201 to S205. Steps S201 to S205 will be mainly described below. Since steps S101 and S106 to S110 of the flowchart of FIG. 4 are similar to those of the flowchart of FIG. 2, a description thereof will be omitted here. Note that in step S109, if there is a shot region not having undergone the imprint process, the process returns to step S201.

In step S201, a control unit 7 supplies the imprint material 14 onto the target shot region of the substrate 10 by a supply unit 5 (first supply process). Step S201 can basically be performed similarly to step S102 of the flowchart of FIG. 2, but the amount of the imprint material 14 (to be sometimes referred to as the supply amount of the imprint material 14) supplied onto the target shot region is different from that in step S102. The supply amount of the imprint material 14 onto the target shot region in step S201 can be decided so as to fill the volume of the concave portion of the concave-convex pattern of a mold 8 but decrease the residual layer thickness as much as possible. For example, the supply amount of the imprint material 14 can be decided, based on the volume of the concave portion of the concave-convex pattern calculated from pattern information indicating the arrangement of the concave-convex pattern of the mold 8, so as to have the residual layer thickness equal to or smaller than a predetermined value (equal to or smaller than 15 nm as an example). Further, in step S201, the supply position of the imprint material 14 is preferably controlled so as to prevent the imprint material 14 remaining on the target shot region after the first separation process in step S203 to be described later from spreading outside the target shot region.

In step S202, the control unit 7 brings the mold 8 into contact with the imprint material 14 on the target shot region (first contact process). Then, in step S203, the control unit 7 separates the mold 8 from the target shot region in a state in which the imprint material 14 on the target shot region is uncured (first separation process). Steps S202 and S203 correspond to a filling process of filling the concave portion of the concave-convex pattern of the mold 8 with the imprint material 14. Since steps S202 and S203 are performed similarly to steps S103 and S104 of the flowchart of FIG. 2, a detailed description thereof will be omitted here. Note that the filling process may further include step S201.

In step S204, the control unit 7 supplies the imprint material 14 onto the target shot region of the substrate 10 by the supply unit 5 (second supply process). More specifically, the control unit 7 causes the supply unit 5 to discharge the imprint material 14 as a plurality of droplets toward the target shot region of the substrate 10 while moving the substrate 10 below the supply unit 5 by the substrate stage 4. With this, the imprint material 14 is supplied as the plurality of droplets onto the target shot region of the substrate 10. The supply amount of the imprint material 14 onto the target shot region in step S204 can be decided such that the residual layer thickness of the concave-convex pattern of the imprint material 14 (cured product) formed on the target shot region by undergoing the imprint process has a desirable thickness distribution (target film thickness distribution). Further, in step S204, the supply position of the imprint material 14 is preferably controlled so as to prevent the imprint material 14 from spreading outside the target shot region (that is, a pattern region 8a of the mold 8) in the second contact process in step S205 to be described later.

Here, the imprint material supplied onto the target shot region in step S204 may be different from the imprint material supplied onto the target shot region in step S201. For example, a second supply unit may be further provided to supply an imprint material having a higher viscosity than the imprint material discharged from the supply unit 5, and the second supply unit may supply the imprint material having the high viscosity onto the target shot region in step S204. With this, it is possible to reduce the spread of the imprint material outside the target shot region (that is, the pattern region 8a of the mold 8) when the mold 8 is brought into contact with the imprint material on the substrate in step S205 to be described later.

The thickness distribution of the residual layer influences the pattern dimension when processing the substrate 10 while using the concave-convex pattern of the cured imprint material 14 as a mask. The imprint material 14 extruding to the outside of the target shot region (the pattern region 8a of the mold 8) can cause a defect after the imprint material 14 is cured. In this embodiment, the process of supplying the imprint material 14 is performed twice to control the thickness distribution of the residual layer, and the supply position of the imprint material 14 is controlled to decrease the imprint material 14 extruding to the outside of the pattern region 8a of the mold 8. With this, the quality of the concave-convex pattern of the cured imprint material 14 can be improved.

In step S205, the control unit 7 brings the mold 8 having undergone the filling process into contact with the imprint material 14 on the target shot region (second contact process). With this, the imprint material 14 filling the concave portion of the concave-convex pattern of the mold 8 by undergoing the filling process can be integrated (merged, combined, or coupled) with the imprint material 14 supplied onto the target shot region. Step S205 can basically be performed similarly to step S105 of the flowchart of FIG. 2, but step S205 can be different from step S105 in that the mold 8 having undergone the filling process is brought into contact with the imprint material 14 further supplied onto the target shot region in the second supply process in step S204.

Also in this embodiment described above, as in the first embodiment, it is possible to reduce bubbles remaining in the imprint material 14 between the mold 8 and the substrate 10, thereby accurately forming a pattern of the imprint material 14 on the substrate 10.

Third Embodiment

The third embodiment according to the present invention will be described. In the second embodiment described above, the example has been described in which the filling process is performed while using the target shot region of the substrate 10 as the predetermined region. However, the predetermined region to be used to perform the filling process is not limited to the target shot region. In this embodiment, an example will be described in which a filling process is performed while using, as a predetermined region, a region provided on a substrate stage. Note that this embodiment basically takes over the second embodiment, and can follow the second embodiment except matters to be described below.

Figure 5:
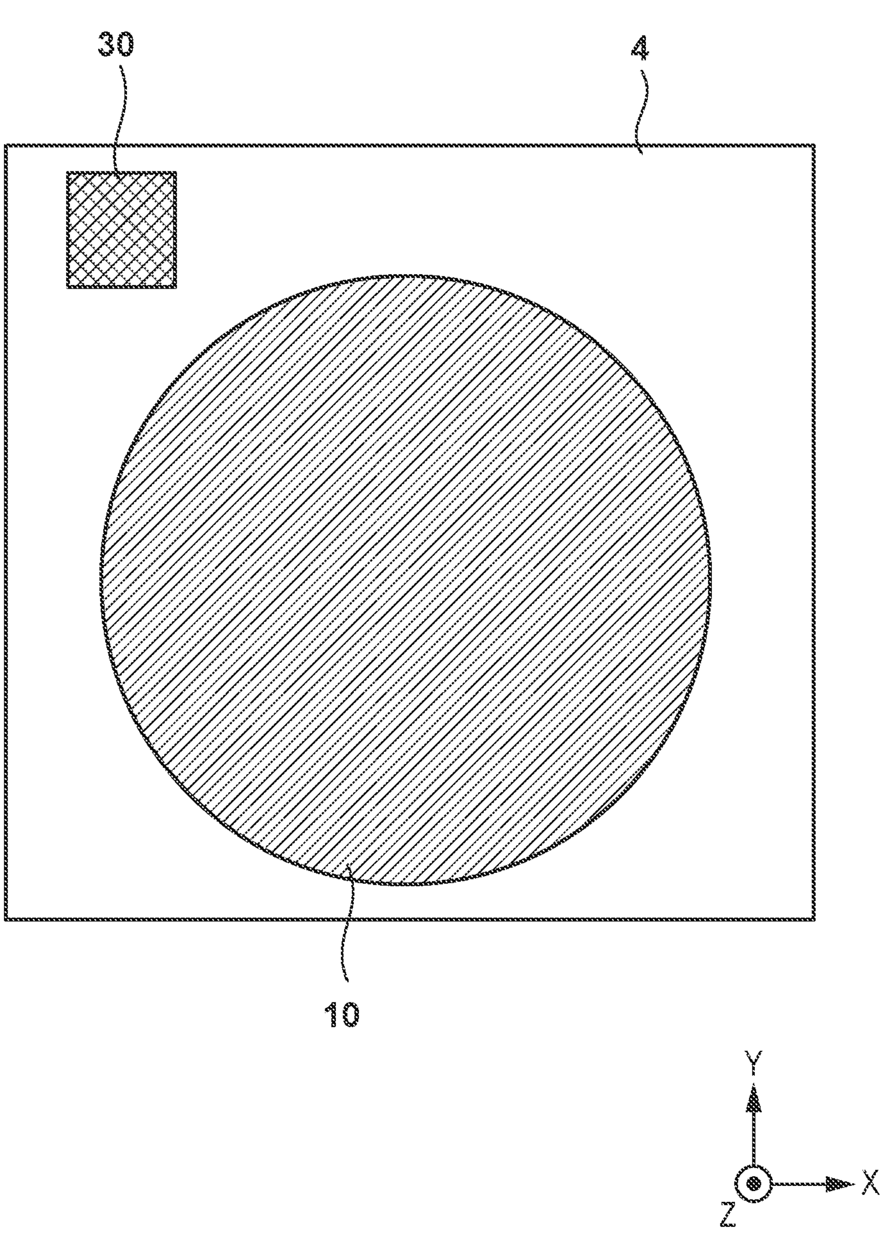
FIG. 5 is a view showing an arrangement example of a substrate stage including a supply region.

FIG. 5 is a schematic view showing a substrate stage 4 viewed from above. As shown in FIG. 5, a supply region 30 to be supplied with an imprint material 14 is provided on the upper surface of the substrate stage 4 as a predetermined region for performing the filling process. In this embodiment, the filling process (steps S201 to S203) is performed while using the supply region 30 of the substrate stage 4 in place of a target shot region.

In the configuration of this embodiment, the imprint material 14 is supplied onto the supply region 30 of the substrate stage 4 by the supply unit 5 in step S201 (first supply process) of the flowchart of FIG. 4. The supply amount of the imprint material 14 at this time is equal to or larger than the volume of the concave portion of the concave-convex pattern of a mold 8. Then, in step S202 (first contact process), the mold 8 is brought into contact with the imprint material 14 on the supply region 30 of the substrate stage 4. In step S203 (first separation process), the mold 8 is separated from the supply region 30 in a state in which the imprint material 14 on the supply region 30 of the substrate stage 4 is uncured. With this, the concave portion of the concave-convex pattern of the mold 8 is filled with the imprint material 14. The remaining steps of the flowchart of FIG. 4 are performed as in the second embodiment, and a description thereof will be omitted here.

According to this embodiment, no imprint material remains on the target shot region of the substrate 10 after the filling process. Therefore, by simply controlling the amount of the imprint material 14 to be supplied onto the target shot region in step S204 (second supply process), the residual layer thickness of the concave-convex pattern of the imprint material 14 (cured product) formed on the substrate can be easily and accurately controlled.

Fourth Embodiment

The fourth embodiment of the present invention will be described. In the third embodiment described above, the example has been described in which the supply region 30 provided on the substrate stage 4 is used as the predetermined region for performing the filling process. On the other hand, in this embodiment, an example will be described in which a supply region 30 is provided on a stage (on a stage 40) movable on a base plate 9 independently of a substrate stage 4. Note that this embodiment basically takes over the second embodiment, and can follow the second embodiment except matters to be described below. In this embodiment, the third embodiment may be further applied, and the supply regions 30 May be provided on both the substrate stage 4 and the stage 40.

Figure 6:
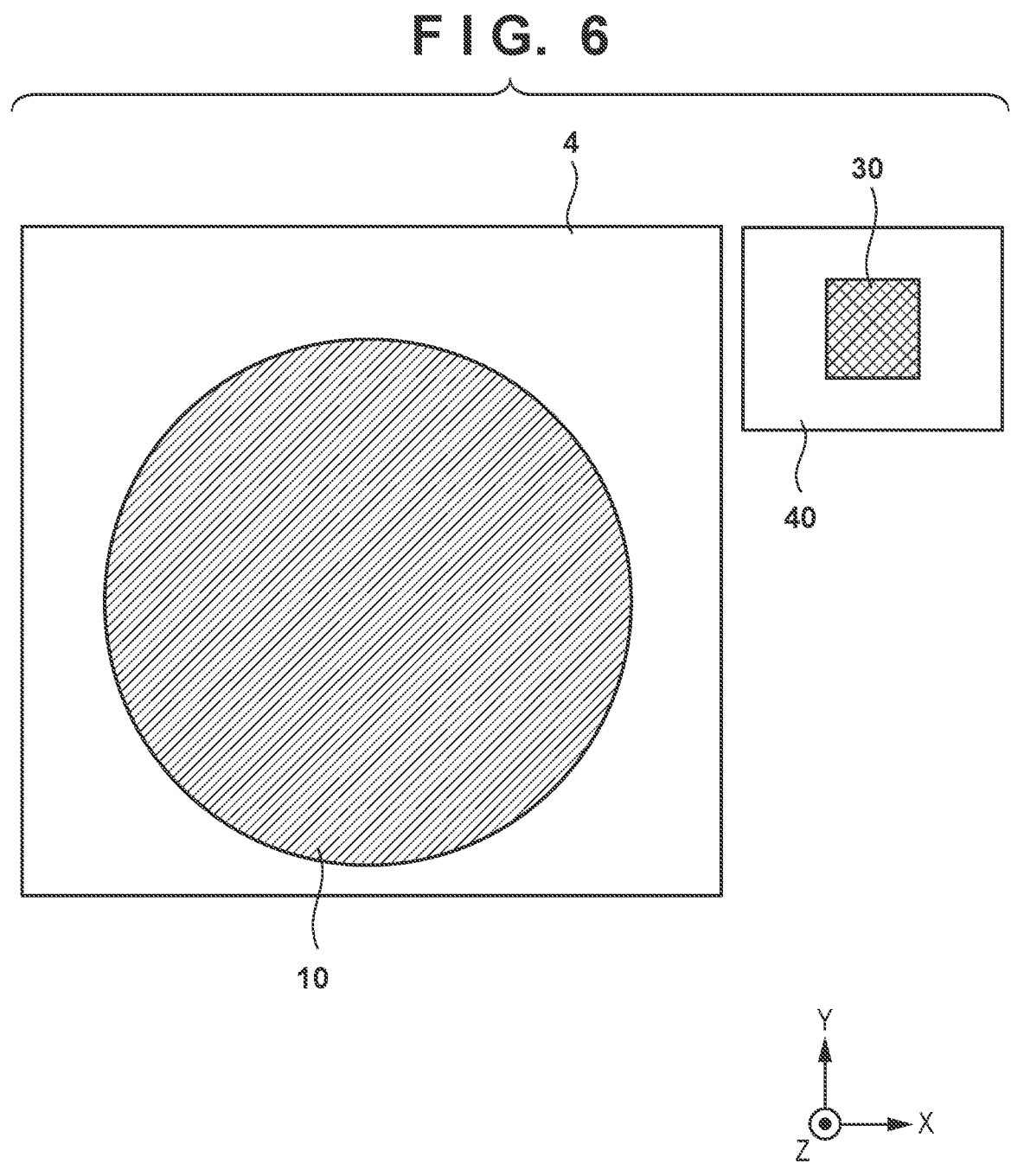

FIG. 6 is a view showing the substrate stage 4 that holds a substrate 10, and the stage 40 provided with the supply region 30. That is, an imprint apparatus 1 according to this embodiment can employ a twin stage arrangement including the substrate stage 4 and the stage 40. In the imprint apparatus 1 having the arrangement as described above, a filling process of a mold 8 using the supply region 30 of the stage 40, and supplying the imprint material 14 onto the substrate 10 (target shot region) on the substrate stage 4 can be performed in parallel. In addition, supplying the imprint material 14 onto the supply region 30 of the stage 40, and bringing the mold 8 into contact with the substrate 10 (target shot region) on the substrate stage 4, that is, transferring the concave-convex pattern of the mold 8 can be performed in parallel.

As has been described above, in the arrangement example of this embodiment, supplying the imprint material 14 onto the substrate 10 and the filling process of the mold 8 can be performed in parallel. Further, bringing the mold 8 into contact with the imprint material 14 on the substrate 10 and supplying the imprint material onto the supply region 30 can be performed in parallel.

Therefore, the arrangement example of this embodiment can be advantageous in improving throughput.

Embodiment of Article Manufacturing Method

An article manufacturing method according to the embodiment of the present invention is suitable for manufacturing an article, for example, a microdevice such as a semiconductor device or an element having a microstructure. The article manufacturing method according to this embodiment includes a forming step of forming a pattern of a composition on a substrate by using the above-described imprint method (imprint apparatus), a processing step of processing the substrate with the pattern of the composition formed thereon, and a manufacturing step of manufacturing an article from the processed substrate. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

The pattern of a cured product molded using the above-described molding apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, an SRAM, a flash memory, and an MRAM and semiconductor elements such as an LSI, a CCD, an image sensor, and an FPGA. Examples of the mold are a mold for imprint and the like.

The pattern of the cured product is directly used as the constituent member of at least some of the above-described articles or used temporarily as a resist mask. After etching or ion implantation is performed in the substrate processing step, the resist mask is removed.

Next, a specific method of manufacturing an article will be described. As shown in FIG. 7A, a substrate 1z such as a silicon wafer with a target material 2z to be processed, such as an insulator, formed on the surface is prepared. Next, an imprint material 3z is applied to the surface of the target material 2z by an inkjet method or the like. A state in which the imprint material 3z is applied as a plurality of droplets onto the substrate is shown here.

As shown in FIG. 7B, a side of a mold 4z for imprint, where a concave-convex pattern is formed, is directed to face the imprint material 3z on the substrate. As shown in FIG. 7C, the mold 4z and the substrate 1z to which the imprint material 3z is applied are brought into contact with each other, and a pressure is applied. The gap between the mold 4z and the target material 2z is filled with the imprint material 3z. In this state, by irradiating the imprint material 3z with light as energy for curing through the mold 4z, the imprint material 3z is cured.

As shown in FIG. 7D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

As shown in FIG. 7E, by performing etching using the pattern of the cured product as an etching resistant mask, a portion of the surface of the target material 2z where the cured product does not exist or remains thin is removed to form a groove 5z. As shown in FIG. 7F, by removing the pattern of the cured product, an article with the grooves 5z formed in the surface of the target material 2z can be obtained. Here, the pattern of the cured product is removed. However, instead of removing the pattern of the cured product after processing, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-205991 filed on Dec. 22, 2022, which is hereby incorporated by reference herein in its entirety.

What is claimed is:

1. An imprint method of forming a patterned composition on a shot region of a substrate by using a mold having a concave-convex pattern, the method comprising:

filling a concave portion of the concave-convex pattern of the mold with a first composition by bringing the mold into contact with the first composition on a predetermined region and then separating the mold from the predetermined region in a state in which the first composition on the predetermined region is uncured;

bringing the mold having undergone the filling into contact with a second composition on the shot region, thereby integrating the first composition filling the concave portion of the concave-convex pattern of the mold with the second composition on the shot region to form an integrated composition;

curing the integrated composition obtained in the bringing to form the patterned composition; and separating the mold from the cured patterned composition obtained in the curing.

2. The method according to claim 1, wherein in the filling, the first composition used to fill the concave portion of the concave-convex pattern of the mold is supplied onto the predetermined region before the mold is brought into contact with the first composition on the predetermined region.

3. The method according to claim 2, wherein an amount of the first composition supplied onto the predetermined region in the filling is not less than a volume of the concave portion of the concave-convex pattern of the mold.

4. The method according to claim 1, wherein
the predetermined region is the shot region, and
in the bringing, the mold having undergone the filling is brought into contact with a portion of the first composition remaining on the shot region after the filling.

5. The method according to claim 1, further comprising
supplying the second composition onto the shot region between the filling and the bringing,
wherein in the bringing, the mold having undergone the filling is brought into contact with the second composition supplied onto the shot region in the supplying.

6. The method according to claim 5, wherein the predetermined region is the shot region.

7. The method according to claim 5, wherein the predetermined region is a region provided on a substrate stage configured to hold the substrate.

8. The method according to claim 5, wherein the predetermined region is a region provided on a stage movable independently of a substrate stage configured to hold the substrate.

9. The method according to claim 1, wherein
in the filling, the mold is brought into contact with the first composition on the predetermined region in a state in which the predetermined region is arranged below the mold.

10. An article manufacturing method comprising:
forming a patterned composition on a substrate by using an imprint method defined in claim 1;
processing the substrate with the patterned composition formed thereon in the forming; and
manufacturing an article from the substrate processed in the processing.

* * * * *